United States Patent
Chen et al.

(10) Patent No.: US 8,946,784 B2
(45) Date of Patent: Feb. 3, 2015

(54) METHOD AND APPARATUS FOR IMAGE SENSOR PACKAGING

(71) Applicant: Taiwan Semiconductor Manufacturing Company, Ltd., Hsin-Chu (TW)

(72) Inventors: Szu-Ying Chen, Toufen Township (TW); Meng-Hsun Wan, Taipei (TW); Dun-Nian Yaung, Taipei (TW); Pao-Tung Chen, Tainan Hsien (TW); Jen-Cheng Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/769,771

(22) Filed: Feb. 18, 2013

(65) Prior Publication Data

US 2014/0231887 A1  Aug. 21, 2014

(51) Int. Cl.

| H01L 27/148 | (2006.01) |
|---|---|
| H01L 29/768 | (2006.01) |
| H01L 27/146 | (2006.01) |
| H01L 31/18 | (2006.01) |

(52) U.S. Cl.
CPC .............. *H01L 27/146* (2013.01); *H01L 31/18* (2013.01)
USPC .... 257/232; 257/214; 257/293; 257/E21.006; 257/E21.051; 257/E21.053; 257/E21.17; 257/E21.189; 257/E21.305; 257/E21.352

(58) Field of Classification Search
USPC ......... 257/232, 293, 214, 133, 234, 288, 292, 257/204, 414, E21.006, E21.051, E21.053, 257/E21.17, E21.189, E21.305, E21.352, 257/21.189

See application file for complete search history.

(56) References Cited

U.S. PATENT DOCUMENTS

| 6,168,965 B1 * | 1/2001 | Malinovich et al. ............ 438/66 |
| 7,315,014 B2 * | 1/2008 | Lee et al. ..................... 250/208.1 |
| 7,615,808 B2 * | 11/2009 | Pain et al. ..................... 257/228 |
| 7,859,033 B2 * | 12/2010 | Brady ............................ 257/294 |
| 8,119,435 B2 * | 2/2012 | Brady ............................ 438/65 |
| 2009/0078973 A1 | 3/2009 | Hsu et al. |
| 2009/0286346 A1 | 11/2009 | Adkisson et al. |
| 2010/0248412 A1 | 9/2010 | Guidash |
| 2011/0049336 A1 | 3/2011 | Matsunuma |
| 2011/0102657 A1 | 5/2011 | Takahashi et al. |
| 2012/0057056 A1 | 3/2012 | Oike |
| 2013/0284885 A1 | 10/2013 | Chen et al. |
| 2013/0334638 A1 | 12/2013 | Chen et al. |

FOREIGN PATENT DOCUMENTS

| JP | 2000-150846 A | 5/2000 |
| JP | 2006287640 A | 10/2006 |
| JP | 2007173861 A | 7/2007 |
| JP | 2012054876 A | 3/2012 |
| KR | 2011-0014986 A | 2/2011 |

* cited by examiner

*Primary Examiner* — David Nhu
(74) *Attorney, Agent, or Firm* — Slater & Matsil, L.L.P.

(57) ABSTRACT

A backside illuminated image sensor having a photodiode and a first transistor in a sensor region and located in a first substrate, with the first transistor electrically coupled to the photodiode. The image sensor has logic circuits formed in a second substrate. The second substrate is stacked on the first substrate and the logic circuits are coupled to the first transistor through bonding pads, the bonding pads disposed outside of the sensor region.

20 Claims, 10 Drawing Sheets

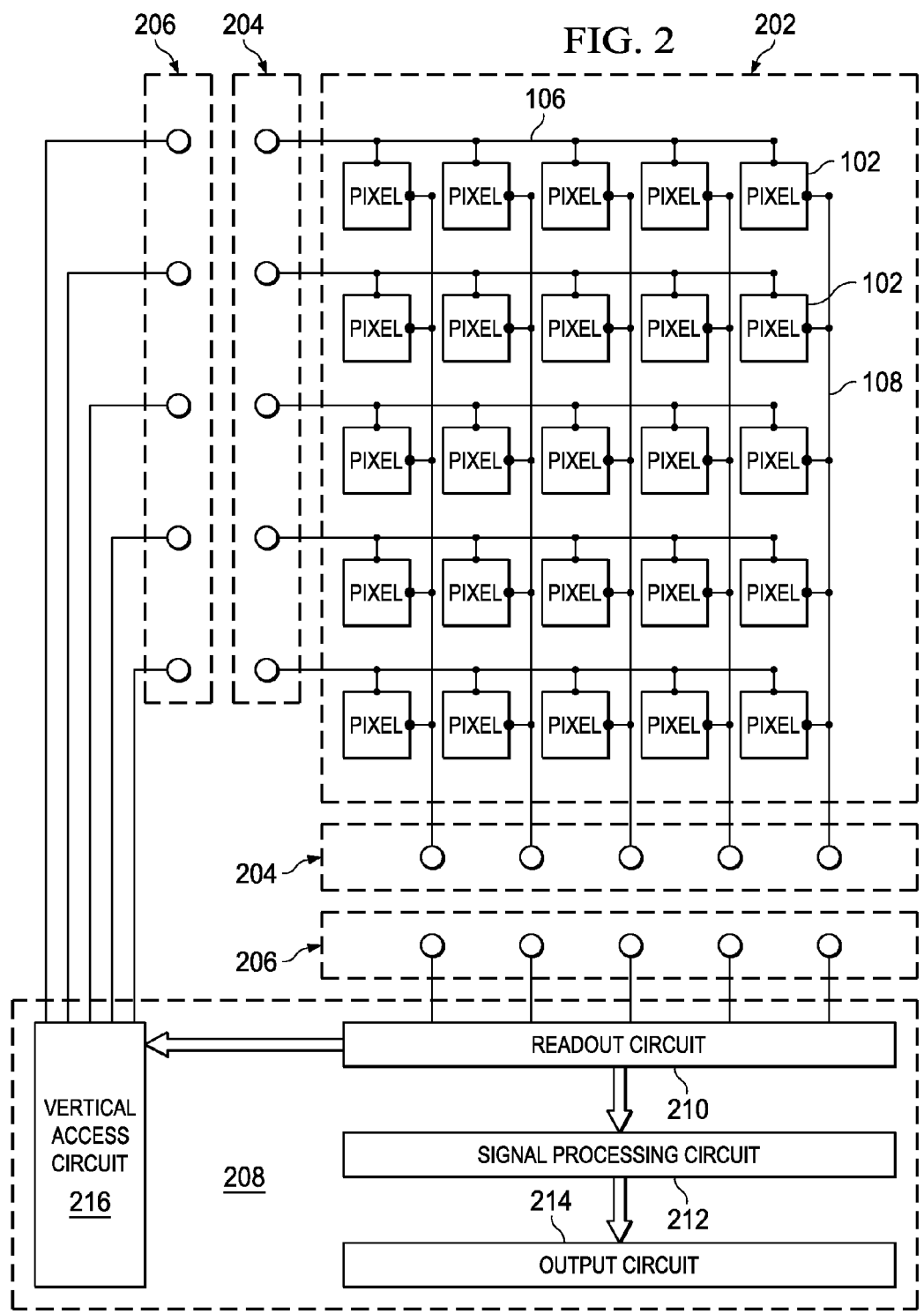

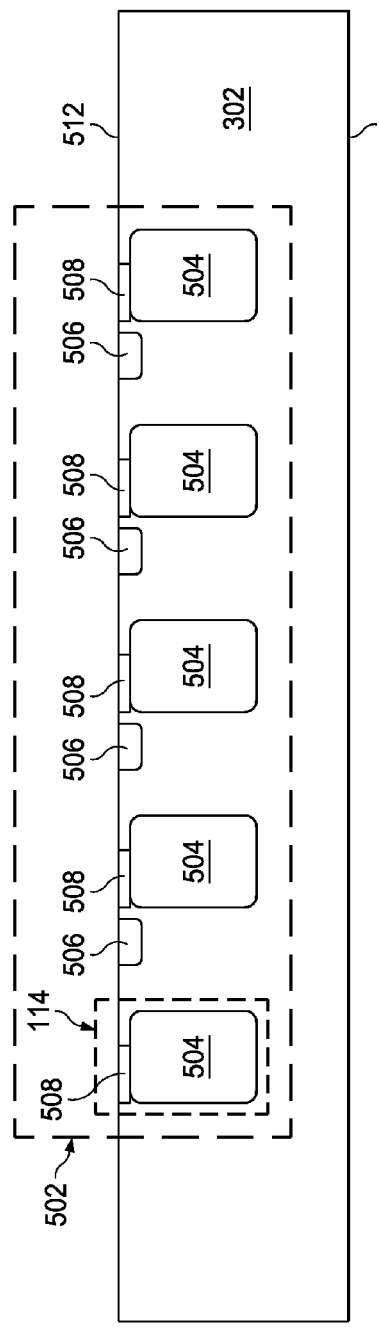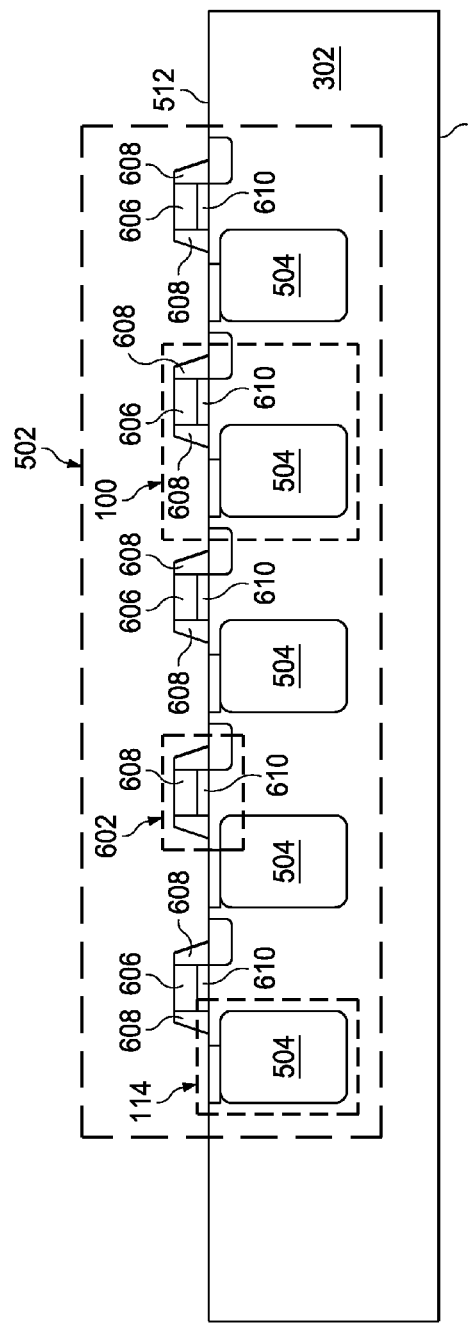

US 8,946,784 B2

METHOD AND APPARATUS FOR IMAGE SENSOR PACKAGING

BACKGROUND

A Metal-oxide semiconductor (MOS) image sensor typically comprises an array of picture elements (pixels), which utilizes light-sensitive MOS circuitry to convert photons into electrons. The light-sensitive MOS circuitry typically comprises a photodiode formed in a silicon substrate. As the photodiode is exposed to light, an electrical charge is induced in the photodiode. Each sensor, or pixel, may generate electrons proportional to the amount of light that falls on the pixel when light is incident on the pixel from a subject scene. The electrons are converted into a voltage signal in the pixel and further transformed into a digital signal which will be processed by an application specific integrated circuit (ASIC) or other circuitry.

A MOS image sensor, or simply a MOS sensor, may have a front side where a plurality of dielectric layers and interconnect layers are located connecting the photodiode in the substrate to peripheral circuitry, and a backside having the substrate. A MOS sensor is a front-side illuminated (FSI) image sensor if the light is from the front side of the sensor; otherwise it is a back-side illuminated (BSI) sensor with light incident on the backside. For a BSI sensor, light can hit the photodiode through a direct path without the obstructions from the dielectric layers and interconnects located at the front side, which helps to increase the number of photons converted into electrons, and makes the MOS sensor more sensitive to the light source.

Three-dimensional (3D) integrated circuits (ICs) may be used to achieve a high density required for current applications, such as image sensor applications. When a MOS sensor is packaged in a 3D IC, a MOS sensor and its related application specific integrated circuit (ASIC) may be bonded to a carrier wafer in parallel, which may take a larger area for the carrier wafer. Therefore there is a need for methods and systems to reduce the package area for MOS sensors related ASICs.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 2 is a logical diagram illustrating a pixel array and associated circuitry;

FIGS. 5-10 are cross-sectional views of an image sensor device in intermediate steps of production according to an embodiment.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1:
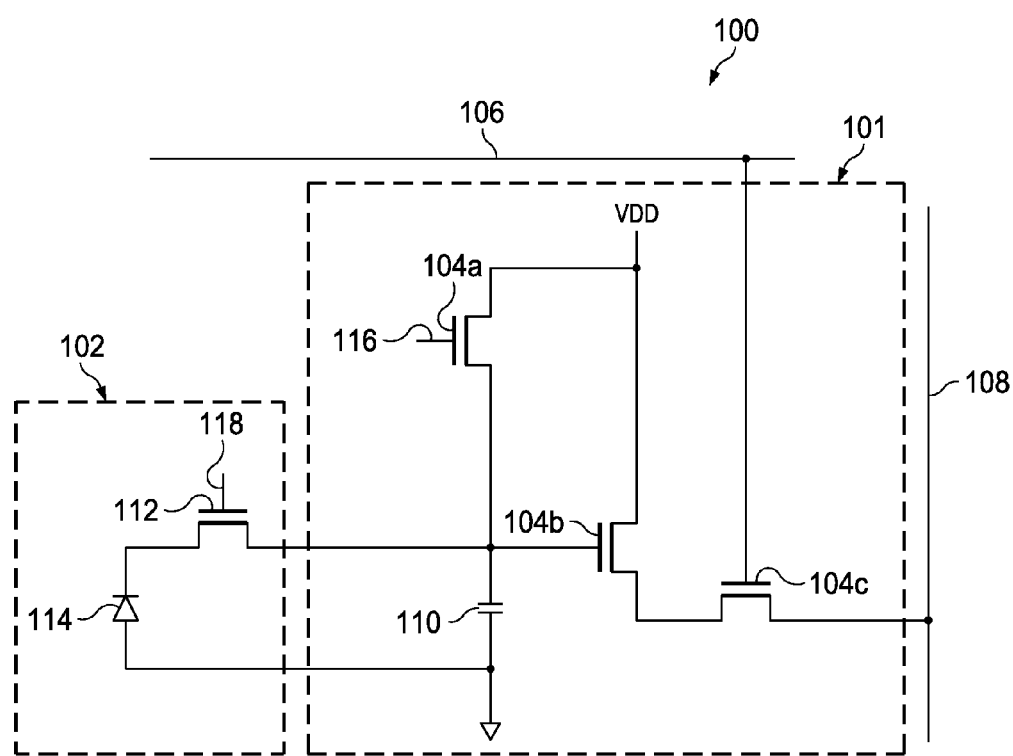
FIG. 1 is a circuit diagram illustrating an embodiment of a circuit for controlling and reading a MOS sensor pixel.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, an image sensor with related control circuitry. The embodiments of the disclosure may also be applied, however, to a variety of image sensors and semiconductor devices. Hereinafter, various embodiments will be explained in detail with reference to the accompanying drawings.

Image sensors generally use control circuitry in order to access each individual pixel in sequence. To reduce the number of connections required to address all pixels in a large array of pixels, individual pixels may be read in multiplexed fashion, with a circuit controlling which row of a pixel array is addressed and separate circuitry controlling which column of a pixel array is addressed. Thus, a single pixel at an activated row and column may be read. Addressing each pixel in sequence permits the control circuitry to assemble a graphic image using data collected from individual pixels.

One parameter affecting the performance of a pixel array is the fill factor, or area of a particular sensor occupied by each individual pixel. Larger pixels permit greater light sensitivity, and consequently, greater image quality. However, larger image sensor dies result in increased cost. Larger pixels in a smaller die gives a greater fill factor and results in greater performance-per-area. One embodiment of the presented disclosure is where the circuitry controlling the pixels is moved to a separate die, e.g., a separate ASIC die that may be mounted on the front, non-illuminated side of the sensor die. While the sensors forming the pixel array may be described as being complimentary metal oxide semiconductor elements, the pixel array may be comprised of charge coupled devices (CCDs) or any other photosensitive element. Additionally, while the term CMOS generally refers to a circuit having both p-type and n-type elements, embodiments of the disclosure may have pixel arrays with elements comprising a single conductivity type, namely, all p-type (PMOS) or all n-type (NMOS) elements. The use of complimentary conductive types in forming the elements of a sensor array and associated circuits provides greater efficiency in the control circuit. Moving the readout and control circuits to a separate ASIC wafer permits the use of both p-type and n-type elements in the control circuits themselves while still permitting the pixel array to be formed from elements of a single or a same conductivity type on the sensor wafer. Thus, all of the transistors on a sensor die may be NMOS device, or all transistors on a sensor die may be PMOS devices.

FIG. 1 is a circuit diagram illustrating a MOS sensor pixel 100 circuit comprising a sensor 102 and pixel control circuit 101. The pixel 100 in a first wafer may be further connected to a readout and control circuit (not shown) in a second wafer. More particularly, circuits in a first wafer are electrically coupled to readout control circuits in the second wafer by stacking the second wafer on top of the first wafer and bonding two wafers together through a plurality of interconnects such as bonding pads. The detailed description of the stacked die structure will be discussed below with respect to subsequent figures.

The pixel 100 comprises a photodiode 114 and a transfer transistor 112 connected in series. In particular, the photodiode 114 may act as a source in the transfer transistor 112, with the gate of the transfer transistor 112 permitting electrons from the photodiode 114 to flow through the transfer transistor 112 when activated. In an embodiment, the transfer transistor 112 and has a gate coupled to a transfer line 118.

In an embodiment, the pixel control circuit 101 comprises a reset transistor 104a, a source follower 104b and a select transistor 104c. The drain of the transfer transistor 112 is coupled to a drain of the reset transistor 104a and a gate of the source follower 104b. The reset transistor 104a has a gate coupled to a reset line 116. A source of the reset transistor 104a is coupled to a voltage source VDD. The reset transistor 104a is used to preset the voltage at the gate of the source follower 104b. A source of the source follower 104b is coupled to the voltage source VDD, and a drain of the source follower 104b is coupled to the source of the select transistor 104c. The source follower 104b provides a high impedance output for the pixel 100. A gate of the select transistor 104c is coupled to a row select line 106. A drain of the select transistor 104c is coupled to an output line 108, which is coupled to a readout control circuit (not shown).

In operation, light strikes the photosensitive region of the photodiode 114. As a consequence, the photodiode 114 generates an electrical charge proportional to the intensity or brightness of light. The electrical charge is transferred by enabling the transfer transistor 112 through a transfer signal applied to the gate of the transfer transistor 112. The electrical charge transferred from the photodiode 114 by the transfer transistor 112 enables the source follower transistor 104b, thereby allowing an electrical charge proportional to the charge generated by the photodiode 114 to pass from the voltage source VDD through the source follower 104b to the select transistor 104c. When sampling is desired, the row select line 106 is enabled, allowing the electrical charge to flow through the select transistor 104c to the data process circuits (not shown) coupled to the output of the select transistor 104c.

It should be noted that FIG. 1 illustrates a schematic diagram of a single pixel 100 in an image sensor. The schematic diagram of the pixel 100 illustrated in FIG. 1 may be duplicated and circuitry may be added to provide a pixel array with multiple pixels. It should further be noted while FIG. 1 illustrates a pixel in a four-transistor structure; a person skilled in art will recognize that the four-transistor diagram is merely an example, which should not unduly limit the scope of the claims. One of ordinary skill in the art would recognize many variations, alternatives, and modifications. For example, various embodiments may include but not limited to three-transistor pixel, five-transistor pixel, a charge couple device (CCD) sensor, and the like.

FIG. 2 is a logical diagram illustrating an array of pixels 100 and associated circuitry. A sensor 202 may comprise a plurality of pixels 100 or sensor elements, such as the pixel 100 illustrated in FIG. 1. In an embodiment, the pixels 100 may be arranged to form a two dimensional pixel array. The illustrated sensor 202 depicts a pixel array of size 5*5 by way of simplified example. Skilled practitioners will readily recognize that the presented embodiments may be applied to any size of pixel array without deviating from the embodied principles. The sensor 202 may also comprise the associated connection lines such as the row select lines 106 and output lines 108. For example, each column of pixels 100 may share an interconnection or an output line 108 connected to one sensor bond pad 204 to transfer pixel outputs to the sensor bond pad 204. Thus, a value of a pixel 100 may be read from the output line 108 when a row of pixels 100 is activated by way of a row select line 106, with the output value coming from the pixel 100 in the column intersecting the activated row. Additionally, while not shown, reset lines 116, transfer lines 118 and like may also be connected to sensor bond pads 204.

In an embodiment, the control circuit 208 may comprise a readout circuit 210 to read the signals from the pixel 100 array. The readout signals will be processed by a signal processing circuit 212. The processed signals are used to generate the output for the image sensor application by an output circuit 214. Other circuits such as a vertical access circuit 216 may be part of the control circuit 208 as well. In an embodiment, the vertical access circuit 216 may apply a voltage to one of the row select lines 106 to activate a row of pixels 100 so that the pixel value may be read on the output line 108. The control circuit 208 may have one or more control circuit bond pads 206 configured to contact the sensor bond pads 204 such that when a control circuit die is mounted on a sensor die, the circuits in the control circuit 208 can read or receive signals from pixel 100 elements in the sensor 202.

Figure 3A:
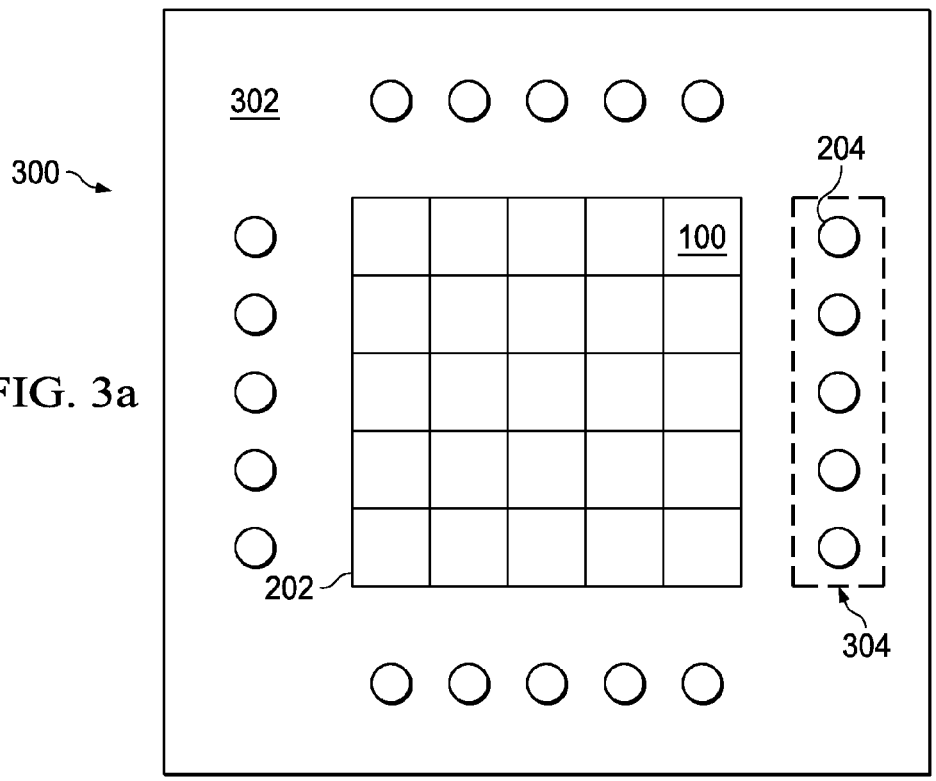
FIGS. 3*a*-4*b* illustrate embodiments of layouts of a sensor and bonding pads on a sensor die.

FIG. 3a illustrates and embodiments of a layout of a sensor 202 and bonding pads 204 on a sensor die 300. The sensor die 300 may comprise one or more sensor bond pads 204 and a sensor substrate 302 with a sensor 202 comprising a plurality of pixels 100. The pixels 100 of the sensor 202 may be disposed within the substrate, such as under one or more metal layers, intermetal dielectrics (IMDs), interlevel dielectrics (ILDs), or the like. A redistribution layer (RDL) having one or more metal features may be formed to permit routing of connections between individual pixels 100 and sensor bond pads 204.

In an embodiment, the sensor bond pads 204 may be disposed outside of, or around, the sensor 202, without being aligned over the sensor 202. For example, a plurality of sensor bond pads 204 may be arranged into sensor bond pad rows 304 with all sensor bond pads 204 disposed outside of the sensor 202. In an embodiment, the sensor bond pads 204 may have a pitch that is about 1.0, about 2.0 or about 3.0 times the pitch of the pixel 100 pitch. The sensor bond pad groups 304 may be disposed along each of four sides of a rectangular, square, or otherwise four-sided sensor.

In an embodiment, the sensor bond pads 204 may each be connected to an output line 108 (See FIG. 1) or to a row select line 106 (See FIG. 1), so that the readout circuit 210 (See FIG. 2) or vertical access circuit 216 (See FIG. 2) may allow the control circuit to read data from individual pixels 100. Additionally, the sensor bond pads may have a common connection to one or more reset transistors 104a in the pixels 100 to permit resetting a portion of, or the entire, sensor 202. The row select lines 106 and output lines 108 may extend from within an area over the sensor 202 outside the sensor 202 to electrically connect with a sensor bond pad 204.

The sensor die 300 may also have dummy bond pads (not shown), arranged within a sensor bond pad row 304, or disposed separately from the sensor bond pads 204. In an embodiment, the dummy bond pads may provide additional bonding points for mounting a control circuit die. Alternatively, the sensor bond pads 204 may be dummy bond pads when the sensor bond pads 204 has no electrical connection to any component on the sensor die 300.

Figure 3B:
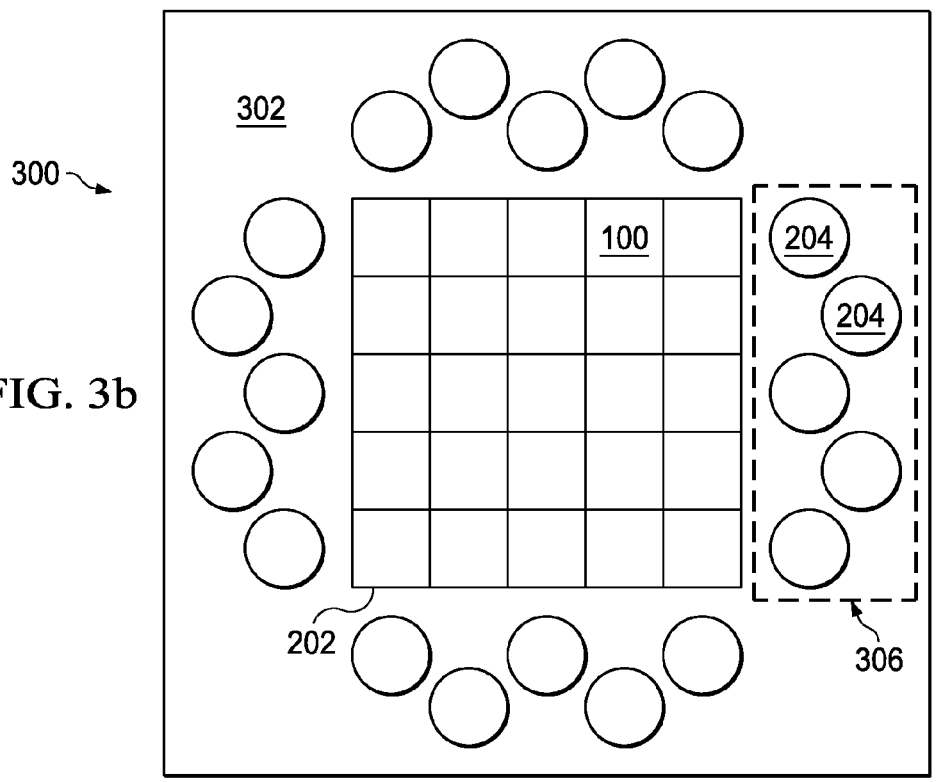

FIG. 3b illustrates another arrangement of the sensor bond pads 204 on the sensor die 300 in accordance with an embodiment. The sensor bond pads 204 in such an embodiment may have a bond pitch about 2 times the pitch of the pixels 100 in the sensor 202. The sensor bond pads 204 may be arranged in a sensor bond pad group 306 with all sensor bond pads 204 disposed outside of the sensor 202 region and in multiple offset rows avoiding overlapping of the sensor bond pads 204.

Figure 4A:
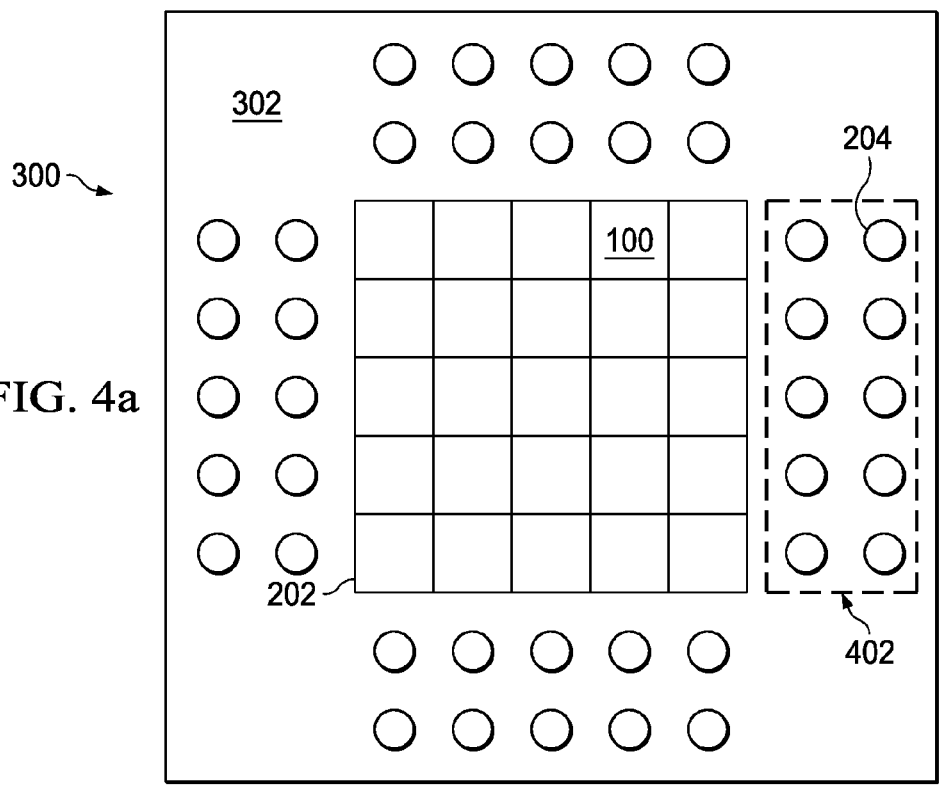

FIG. 4a illustrates another arrangement of the sensor bond pads 204 on the sensor die 300 in accordance with an embodiment. The sensor bond pads 204 in such an embodiment may have a bond pitch about the same as the pitch of the pixels 100 in the sensor 202. The sensor bond pads 204 may be arranged in sensor bond pad groups 402 in multiple rows with all sensor bond pads 204 disposed outside of the sensor 202. The sensor bond pad group 402 may, in an embodiment, have sensor bond pads 204 in a regular grid, with sensor bond pads 204 in a first row aligned with a second row.

Figure 4B:
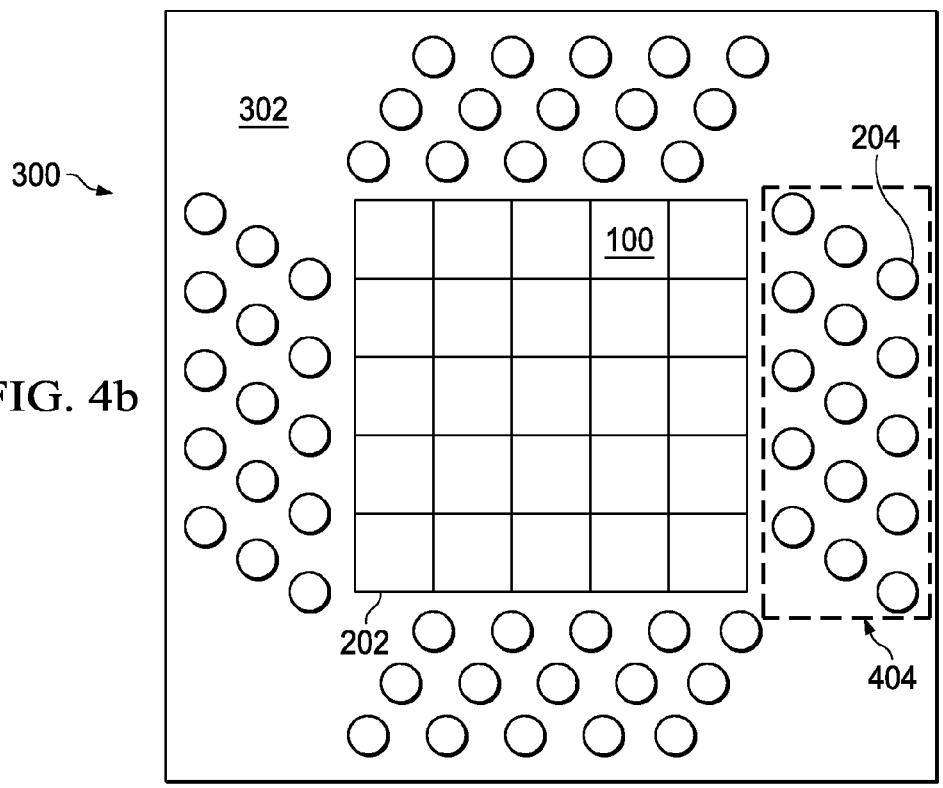

FIG. 4b illustrates another arrangement of the sensor bond pads 204 on the sensor die 300 in accordance with an embodiment. The sensor bond pads 204 in such an embodiment may have a bond pitch about the same as the pitch of the pixels 100 in the sensor 202. The sensor bond pads 204 may be arranged in a sensor bond pad group 404 in multiple rows, with all sensor bond pads 204 disposed outside of the sensor 202. In such an embodiment, adjacent rows may be offset, providing greater packing between round sensor bond pads in particular.

The aforementioned sensor bond pad 204 arrangements disclosed herein are intended to be exemplary and are not limiting. Other sensor bond pad 204 arrangements are possible without deviating from the presented disclosure.

FIGS. 5-10 are cross-sectional view of an image sensor device in intermediate steps of production according to an embodiment. Referring firs to there is shown a sensor die substrate having a sensor region 502 defined therein. The sensor die substrate 302 may be a wafer, die, or the like. The sensor region 502 may include one or more photosensitive regions 504 corresponding to the pixels 100. A photodiode 114 may be comprised of a photosensitive region 504 a surface layer 508 implanted. A drain 506 may also be implanted for each pixel 100, with the drain 506 and photodiode acting as the drain and source regions for a transistor described in greater detail below.

FIG. 6 is a cross-sectional view illustrating formation of a transfer gate 602 for an image sensor device according to an embodiment. The transfer gate 602 may span the drain region 506 and photodiode 114 to form the pixel. The transfer gate 602 may comprise an insulating layer 610 and a gate contact 606. In an embodiment, the transfer gate 602 may also comprise gate spacers 608. Additional sensor control circuit transistors and interconnections may also be formed on the sensor die substrate 302 and connected to individual pixels 100.

Figure 7:
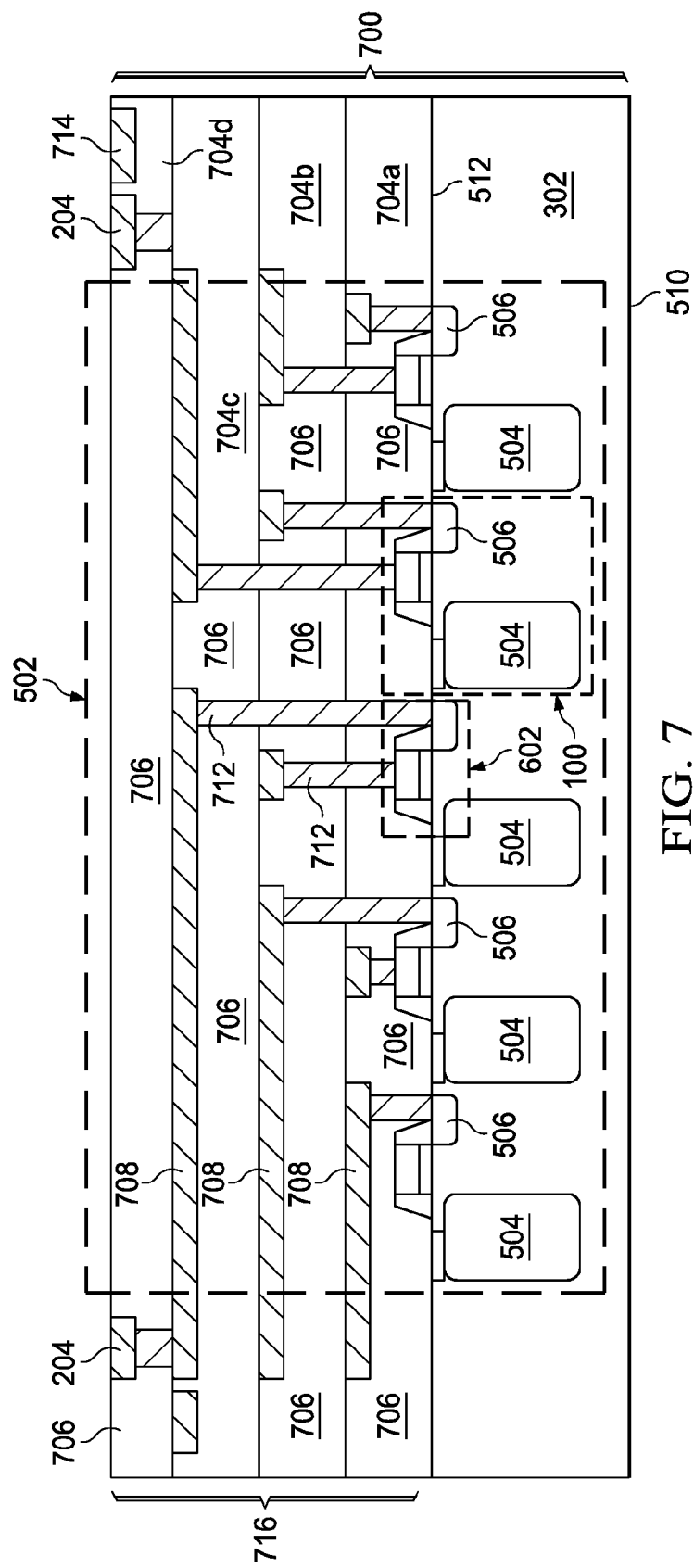

FIG. 7 is a cross-sectional view illustrating formation of one or more redistribution layers (RDLs) 716 and sensor bond pads 204 according to an embodiment. A sensor die 700 may have RDLs 716 formed on the frontside of the sensor die substrate 302. The RDLs 716 may comprised one or more dielectric layers 704a, 704b, 704c, 704d with conductive lines 708 and vias 712 disposed in a dielectric material to form the dielectric layers 704a, 704b, 704c, 704d and connect elements from a pixel 100 to a bond pad 204. The bond pads 204 may be formed in the uppermost dielectric layer 704d, with a top surface of the bond pads 204 exposed through the top surface of the dielectric layer 704d. Additionally, package bond pads 714 may also be formed in the uppermost dielectric layer 704d allowing for subsequent formation of package mount interconnects (not shown). The sensor bond pads 204 and package bond pads 714 may be formed outside the sensor region 502.

Figure 8:
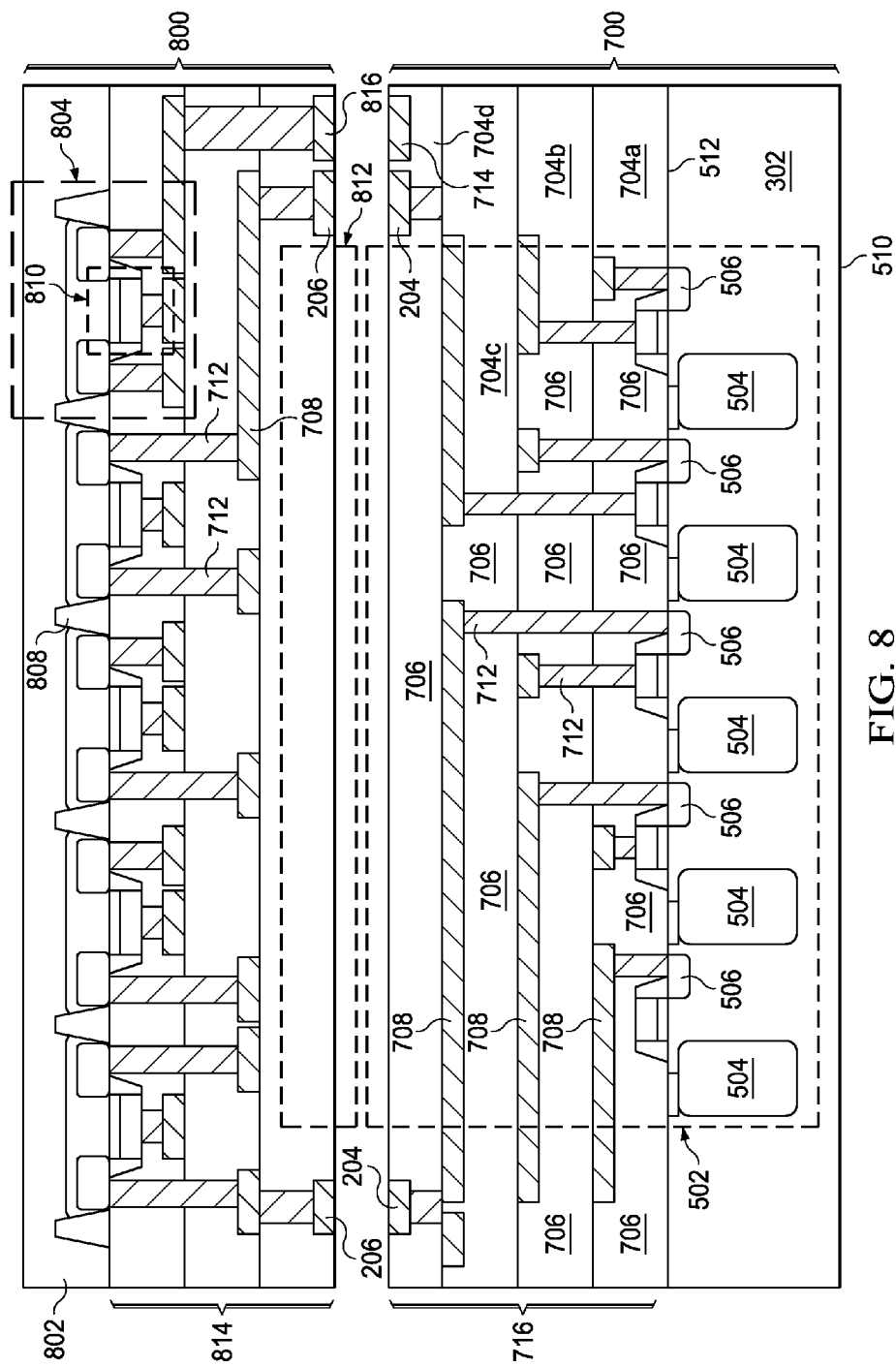

FIG. 8 is a cross-sectional view illustrating a sensor die 700 and a control circuit die 800. The control circuit die 800 may have one or more control circuit transistors 804 disposed in a control circuit die substrate 802. A control circuit transistor 804 may comprise source and drain regions 806 and gate 810. In an embodiment, shallow trench isolation (STI) structures 808 may be disposed between adjacent control circuit transistors 804 to isolate each control circuit transistor 804 from adjacent elements. Additionally, the control circuit die 800 may comprise one or more RDLs, such as RDL 814 having metal lines 708 and vias 712 connecting the SAIC bond pads 206 to elements of the control circuit transistors 804.

Figure 9:
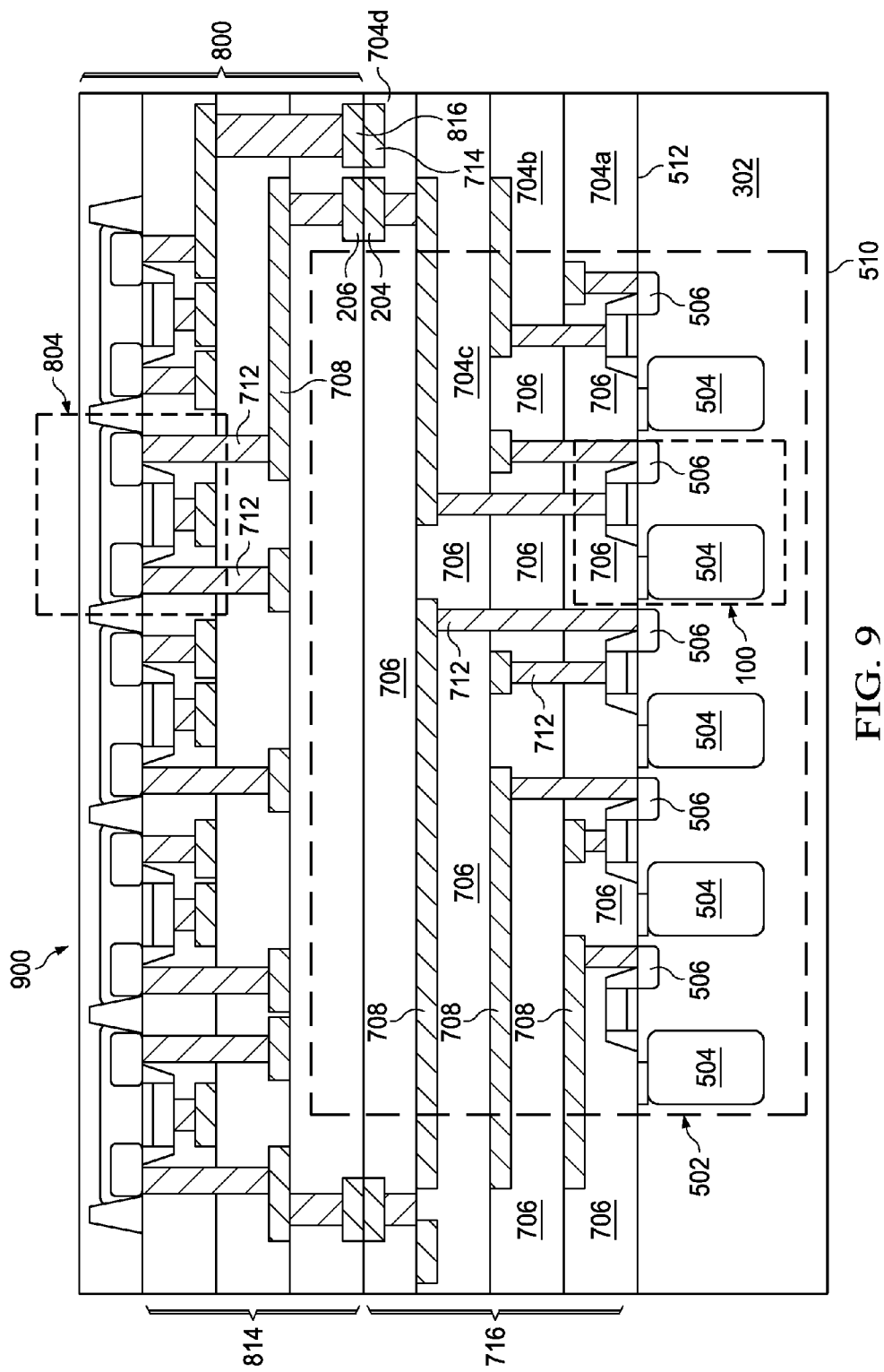

FIG. 9 is a cross-sectional view illustrating bonding the sensor die 700 and a control circuit die 800. In an embodiment, the control circuit die 800 may be bonded to the sensor die 700 to form a stacked structure 900 and so that the sensor bond pads 204 are in electrical contact with the control circuit bond pads 206, permitting devices on the control circuit die 800 such as a control circuit transistor 804 to access or control the pixels 100 on the sensor die 700.

Various bonding techniques may be employed to achieve bonding between the sensor die 700 and the control circuit die 800. In accordance with an embodiment, suitable bonding techniques may include direct bonding, hybrid bonding and the like. In an embodiment, a thermo-compression process may be performed on the sensor die 700 and control circuit die 800. Such a thermo-compression process may lead to metal inter-diffusion. More particularly, in an embodiment, the bond pads 204 and 206 may be copper and the copper atoms of the sensor bond pads 204 and control circuit bond pads 206 acquire may enough energy to diffuse between adjacent bonding pads. As a result, a homogeneous copper layer is formed between two adjacent bonding pads. Such a homogeneous copper layer helps the sensor bond pads 204 and the control circuit bond pads 206 such form a uniform bonded feature. In addition, the uniform bonded feature also provides a mechanical bond to hold the sensor die 700 to the control circuit die 800. While the bond pads 204 and 206 are shown as substantially planar with the surface of the RDL, in an embodiment, the bond pads 204 and 206 may extend above the surfaces of the RDLs 716 and 814. In such an embodiment, the bond pads 204 and 206 may be fused by metal-to-metal contact, and the RDLs 716 and 814 spaced apart. An underfilling or adhesive (not shown) may be formed between the RDLs 716 and 814 where such spacing occurs.

In an embodiment, the sensor die 700 and the control circuit die 800 may also be bonded together using a suitable technique. An anneal process may be performed on the stacked semiconductor structure in a chamber with inert gases such as argon, nitrogen, helium and the like to bond the RDLs 716 and 814. The RDLS 716 and 814 maybe bonded through an oxide-to-oxide or dielectric-to-dielectric bonding process. As a result, the sensor bond pads 204 and the control circuit bond pads 206 are reliably bonded together through the anneal process.

While the bonding process herein is described in terms of bonding a sensor die 700 to a control circuit die 800, the dies 700 and 800 may be bonded as part of a larger wafer bonding procedure. A sensor wafer may be comprised of a plurality of sensor dies 700, and a control circuit wafer may be comprised of a plurality of control circuit dies 800. Fabricating the control circuit dies 800 separately from the sensor dies 700 may permit interchanging of dies to match specific applications or to upgrade one die 700 and 800 without requiring the complementary die to be refabricated. For example, a standardized sensor die 700 may have any number of different control circuit mounted thereon, with each control circuit die 800 having, for example, a different output format. In an embodiment, the sensor bond pads 204 will have the same pitch and arrangement as the control circuit bond pads 206, so that the bond pads line up accurately when the dies 700 and 800 are bonded.

The wafer-to-wafer bonding may be performed on wafers having a substantially matched size. Additionally, in an embodiment, the sensor die 700 size and the control circuit die 800 size may be somewhat matched, with the sensor die 700 size being between about 80% and about 120% of the control circuit die 800 size. In one embodiment, buffer regions or dummy patterns may be added to each sensor die 700 or to each control circuit die 800 in a wafer to bring the die size into the predetermined size range comparable to the complementary die.

Additionally, the bonding of a sensor die 700 to the control circuit die 800 is not limited to a one-to-one bonding. In an embodiment, multiple dies may be attached to a single control circuit die 800, or multiple dies may be mounted on a sensor die 700. For example, a control circuit die 800 may have a sensor die 700 mounted thereon, and may also have additional dies such as communications dies, memory dies, additional processing dies, or the like mounted thereon. In another embodiment, a sensor die 700 may have a control chip die 800 and one or more additional dies such as a memory die, communications die additional processor die or the like mounted thereon.

Figure 10:
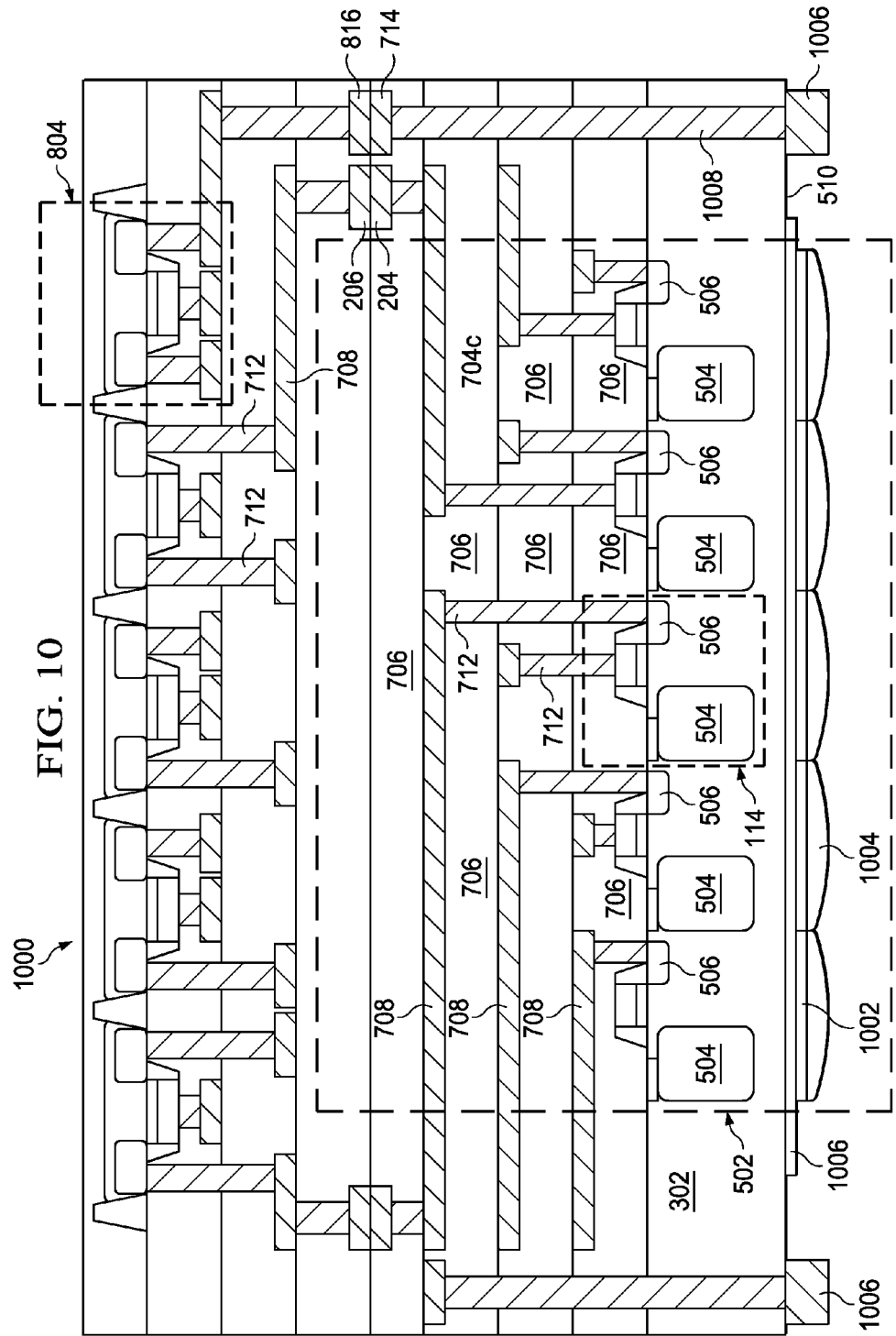

FIG. 10 is a cross sectional view of a sensor package 1000 with filters and lenses. The sensor die substrate 302 is thinned at the backside 510 until the sensor die substrate 302 reaches a predetermined thickness. Such a thinned sensor die substrate 302 allows light to pass through the substrate and hit the photosensitive regions 504 of the photodiodes 114 embedded in the sensor die substrate 302 without being absorbed by the sensor die substrate 302.

In an embodiment, the thinning process may be implemented by using suitable techniques such as grinding, polishing and/or chemical etching. In accordance with an embodiment, the thinning process may be implemented by using a chemical mechanical polishing (CMP) process. In a CMP process, a combination of etching materials and abrading materials are put into contact with the backside of the sensor die substrate 302 and a grinding pad (not shown) is used to grind away the backside of the sensor die substrate 302 until a desired thickness is achieved.

In an embodiment, an optical coating such as an antireflective coating 1006 may be applied to the backside 510 of the sensor package 1000. A color filter layer 1002 may be applied to the backside of the sensor die substrate 302 in accordance with an embodiment, or over the optical coating where used. The color filter layer 1002 may be used to allow specific wavelengths of light to pass while reflecting other wavelengths, thereby allowing the image sensor to determine the color of the light being received by the photosensitive region 504. The color filter layer 1002 may vary, such as a red, green, and blue filter. Other combinations, such as cyan, yellow, and magenta, may also be used. The number of different colors of the color filters 1002 may also vary.

In accordance with an embodiment, the color filter layer 1002 may comprise a pigmented or dyed material, such as an acrylic. For example, polymethyl-methacrylate (PMMA) or polyglycidylmethacrylate (PGMS) are suitable materials with which a pigment or dye may be added to form the color filter layer 1002. Other materials, however, may be used. The color filter layer 1002 may be formed by another suitable method known in the art.

A mircolens layer 1004 may be applied in accordance with an embodiment. The microlens layer 1004 may be formed of any material that may be patterned and formed into lenses, such as a high transmittance, acrylic polymer. In an embodiment, the microlens layer 1004 is about 0.1 um to about 2.5 um in thickness. The microlens layer 1004 may be formed using a material in a liquid state and spin-on techniques known in the art. This method has been found to produce a substantially planar surface and a microlens layer 1004 having a substantially uniform thickness, thereby providing greater uniformity in the microlenses. Other methods, such as deposition techniques like chemical vapor deposition (CVD), physical vapor deposition (PVD), or the like, may also be used.

One or more mounting pads 1006 and mounting vias 1008 may also be formed on the sensor package 1000. The mounting vias 1008 may electrically connect a mounting pad to a package bond pad 174, permitting one or more control circuit transistors 804 to communicate with an external device when the sensor package 1000 is mounted.

Figure 11:
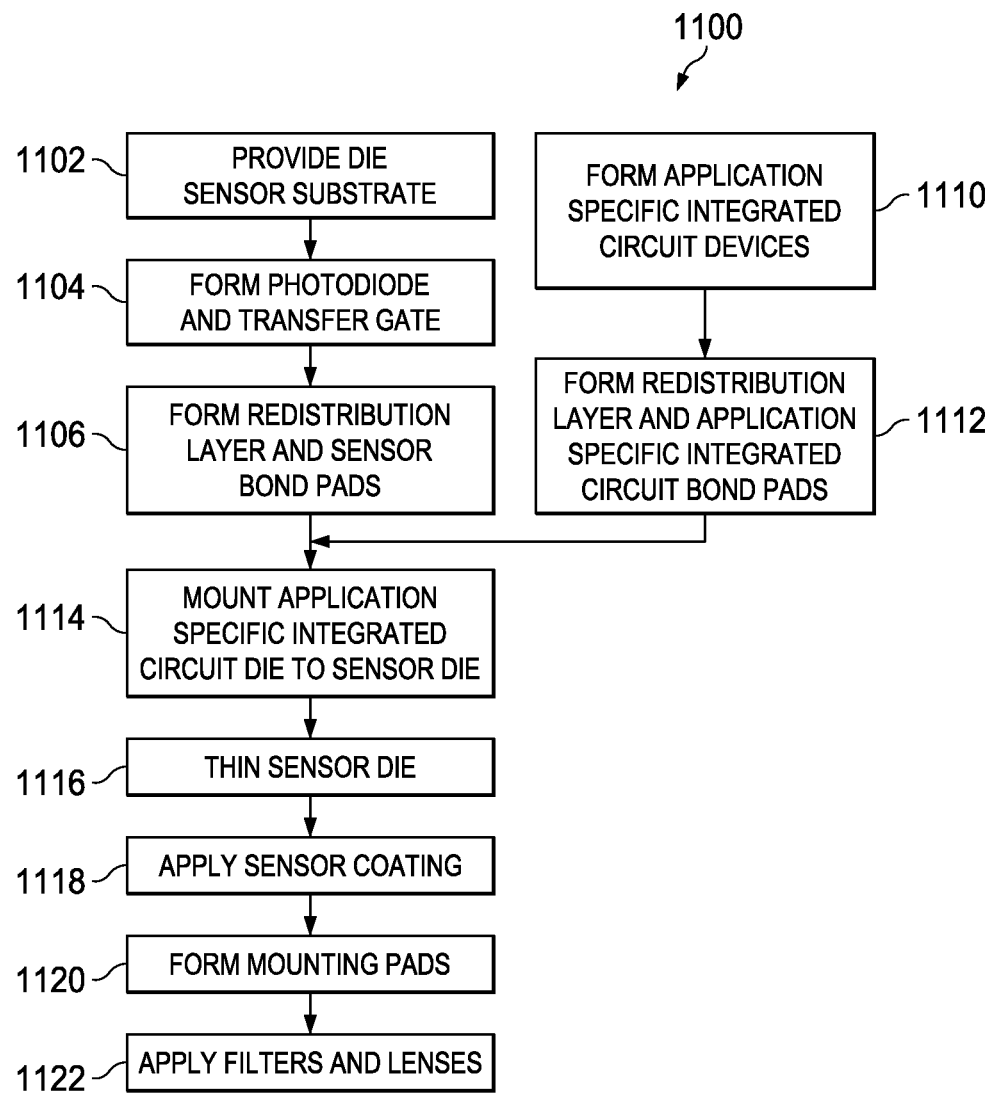
FIG. 11 is a flow chart of a method for forming an image sensor device in accordance with an embodiment.

FIG. 11 is a flow diagram illustrating a method 1100 of forming a sensor package 1000. A sensor die substrate 302 may be provided in block 1102 and the photodiode 114, transfer gate 602 and drain 506 formed on the sensor die substrate 302 in block 1104. A sensor region 502 may be defined, with the pixels 100 inside the sensor region 502. An RDL layer 716 and sensor bond pads 204 may be formed in block 1106. A control circuit die 800 may be fabricated with control circuit devices 804 formed in block 1110 and an RDL 814 and control circuit bond pads 206 formed in block 1112. The control circuit formation steps of block 1110 and 1112 may be performed separately from, and without dependency on, the sensor formation steps of block 1102, 1104 and 1106.

The control circuit die 800 may be mounted on the sensor die 700 in block 1114. The sensor die substrate 302 may be thinned in block 1116, and an optical coating such as an antireflective coating 1006 applied in block 1118. Mounting pads 1006 and any associated mounting vias 1008 may be formed in block 1120. Filters and lenses such as color filter layers 1002 and microlenses 1004 may be applied in block 1122.

Thus, a device fabricated according to an embodiment may comprise a sensor die having a sensor region, a plurality of pixels disposed within the sensor region, and a plurality of sensor bond pads disposed outside the sensor region, each of the plurality of sensor bond pads having a surface exposed through a frontside of the sensor die. The device may further comprise a control circuit die having at least one sensor control circuit and a plurality of control circuit bond pads. Each of the plurality of control circuit bond pads may be bonded to at least one of the plurality of sensor bond pads. The pixels may optionally comprise transistor elements having a same conductivity type. The pixels may comprise one of charge coupled devices, n-type metal oxide semiconductor devices or p-type metal oxide semiconductor devices.

In an embodiment, the device may further comprise an RDL having a plurality of dielectric layers, with the sensor bond pads disposed in an uppermost dielectric layer of the RDL. The pixels may be arranged in a grid and have a pitch, and the sensor bond pads may have a pitch that is about 1.0, about 2.0 or about 3.0 times the pitch of the plurality of pixels.

In an embodiment, at least one sensor control circuit of the control circuit die comprises a vertical access circuit and a readout circuit. The sensor die may comprise a plurality of row select lines, with each of the plurality of row select lines electrically connected to a plurality of pixels in a row and to a sensor bond pad. The sensor die may also comprise a plurality of output lines, with each of the plurality of output lines electrically connected to a plurality of pixels in a column and to a sensor bond pad.

A sensor device fabricated according to an embodiment may comprise a sensor region, a plurality of backside illuminated pixels disposed within the sensor region, and a plurality of sensor bond pads disposed outside the sensor region, each of the plurality of sensor bond pads having an exposed surface. In such an embodiment, the device may further comprise a plurality of row select lines, each of the plurality of row select lines electrically connected to a plurality of pixels in a row and extending from within the sensor region to outside of the sensor region, and further electrically connected to a sensor bond pad. The device may further comprise a plurality of output lines, each of the plurality of output lines electrically connected to a plurality of pixels in a column extending from within the sensor region to outside of the sensor region, and further electrically connected to a sensor bond pad.

The backside illuminated pixels may comprise transistor elements having a same conductivity type, and all transistors in the device may have a same conductivity type. The sensor device of Claim 9, wherein the backside illuminated pixels may comprise one of charge coupled devices, n-type metal oxide semiconductor devices or p-type metal oxide semiconductor devices.

The sensor device may optionally have a sensor region with four sides and the bond pads may be arranged into a plurality of bond pad groups, at least one of the plurality of bond pad groups disposed at each side of the sensor region and outside of the sensor region. Each of the plurality of pixels may comprise a reset transistor having a gate, at least one sensor bond pad electrically connected to a gate of a reset transistor of at least one of the plurality of pixels.

A method of forming a sensor device according to an embodiment may comprise providing a sensor substrate having a plurality of pixels disposed in a sensor region, the sensor substrate further having one or more redistribution layers (RLDs) on a frontside of the sensor substrate and a plurality of sensor bond pads in an uppermost RDL, each of the plurality of sensor bond pads disposed outside the sensor region. The method may further comprise providing a control circuit die having a plurality of control circuits and a plurality of control circuit bond pads. The control circuit die may be mounted to the sensor die, with each of the plurality of control circuit bond pads in electrical contact with one of the plurality of sensor bond pads. The method may further comprise thinning a backside of the sensor substrate. Thinning the backside of the sensor substrate may be performed after mounting the control circuit die, the sensor substrate thinned such that the pixels are backside illuminated.

Mounting the control circuit die may comprise forming at least one of a metal-to-metal bond between the control circuit bond pads and the sensor bond pads, a dielectric-to-dielectric bond between the sensor die and the control circuit die or an oxide-to-oxide bond between the sensor die and the control circuit die.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a sensor die comprising
      a sensor region;
      a plurality of pixels disposed within the sensor region; and
      a plurality of sensor bond pads disposed outside the sensor region, each of the plurality of sensor bond pads having a surface exposed through a front side of the sensor die; and
   a control circuit die comprising:
      at least one sensor control circuit; and
      a plurality of control circuit bond pads, each of the plurality of control circuit bond pads bonded to at least one of the plurality of sensor bond pads.

2. The device of claim 1, wherein transistors of the pixels are comprised solely of NMOS transistors or solely of PMOS transistors.

3. The device of claim 1, wherein the pixels comprise one of charge coupled devices, n-type metal oxide semiconductor devices or p-type metal oxide semiconductor devices.

4. The device of claim 1, further comprising a one or more redistribution layers (RDLs), the sensor bond pads disposed in an uppermost dielectric layer of the RDLs.

5. The device of claim 1, the sensor bond pads having a pitch that is one of about 1.0, about 2.0 or about 3.0 times the pitch of the plurality of pixels.

6. The device of claim 1, wherein the at least one sensor control circuit comprises at least a vertical access circuit.

7. The device of claim 6, wherein the at least one sensor control circuit further comprises a readout circuit.

8. The device of claim 1, further comprising:
   a plurality of row select lines, each of the plurality of row select lines extending between and electrically connected to a plurality of pixels in a row and further electrically connected to a sensor bond pad; and
   a plurality of output lines, each of the plurality of output lines extending between and electrically connected to a plurality of pixels in a column and further electrically connected to a sensor bond pad.

9. A sensor device comprising:
   a sensor region;
   a plurality of backside illuminated pixels disposed within the sensor region;
   a plurality of sensor bond pads disposed outside the sensor region, each of the plurality of sensor bond pads having an exposed surface;
   a plurality of row select lines, each of the plurality of row select lines electrically connected to a plurality of pixels in a row and extending from within the sensor region to outside of the sensor region, each of the plurality of row select lines further electrically connected to a sensor bond pad; and
   a plurality of output lines, each of the plurality of output lines electrically connected to a plurality of pixels in a column extending from within the sensor region to outside of the sensor region, each of the plurality of output lines electrically connected to a sensor bond pad.

10. The sensor device of claim 9, wherein transistors of the backside illuminated pixels are comprised solely of NMOS transistors or solely of PMOS transistors.

11. The sensor device of claim 9, wherein transistors disposed on the sensor device are comprised solely of NMOS transistors or solely of PMOS transistors.

12. The sensor device of claim 9, wherein the backside illuminated pixels comprise one of charge coupled devices, n-type metal oxide semiconductor devices or p-type metal oxide semiconductor devices.

13. The sensor device of claim 9, wherein the sensor region has four sides and the bond pads are arranged into a plurality of bond pad groups, at least one of the plurality of bond pad groups disposed at each side of the sensor region and outside of the sensor region.

14. The sensor device of claim 9, each of the plurality of pixels comprising a reset transistor having a gate, at least one sensor bond pad electrically connected to a gate of a reset transistor of at least one of the plurality of pixels.

15. A device, comprising:
a plurality of backside illuminated pixels disposed within a sensor region of a sensor die;
a plurality of sensor bond pads disposed in the sensor die and outside the sensor region, each of the plurality of sensor bond pads having a surface exposed at a front side of the sensor die;
a plurality of row select lines, each of the plurality of row select lines electrically connecting a plurality of the pixels in a row to a respective one of the plurality of sensor bond pads;
a plurality of output lines, each of the plurality of output lines electrically connecting a plurality of pixels in a column to a respective one of the plurality of sensor bond pads;
at least one sensor control circuit disposed in a control circuit die; and
a plurality of control circuit bond pads disposed in the control circuit die, each of the control circuit bond pads having a surface exposed at a front side of the control circuit die;
wherein each of the plurality of control circuit bond pads are coupled to a respective one of the plurality of sensor bond pads; and
wherein the sensor region is substantially free of metal features exposed at the front side of the sensor die.

16. The device of claim 15, wherein the sensor region has four sides and the sensor bond pads are arranged into a plurality of bond pad groups, at least one of the plurality of bond pad groups disposed at each side of the sensor region.

17. The device of claim 16, wherein each of the plurality of bond pad groups comprises two or more rows, each of the two or more rows having two or more sensor bond pads, wherein the two or more rows in each of the plurality of bond pads groups are substantially parallel to each other and to one of the four sides of the sensor region.

18. The device of claim 15, wherein the sensor circuit has a first redistribution layer (RDL) disposed at the front side of the sensor die;
wherein the control circuit die comprises a second RDL disposed at the front side of the control circuit die;
wherein the sensor bond pads are exposed at a front side of the first RDL;
wherein the control circuit bond pads are exposed at a front side of the second RDL; and
wherein the front side of the first RDL is bonded to the front side of the second RDL.

19. The device of claim 18, wherein the sensor bond pads are bonded to the control circuit bond pads.

20. The device of claim 15, wherein the control circuit die comprises at least a vertical access circuit and a readout circuit, each in signal communication with the plurality of pixels through the sensor bond pads.

* * * * *